(12) United States Patent
Oka et al.

(10) Patent No.: US 10,638,603 B2
(45) Date of Patent: Apr. 28, 2020

(54) MULTILAYER CERAMIC SUBSTRATE

(71) Applicant: Murata Manufacturing Co., Ltd., Nagaokakyo-shi, Kyoto-fu (JP)

(72) Inventors: Takahiro Oka, Nagaokakyo (JP); Yoshitake Yamagami, Nagaokakyo (JP); Yuki Takemori, Nagaokakyo (JP); Kazuo Kishida, Nagaokakyo (JP); Hiromichi Kawakami, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 16/596,981

(22) Filed: Oct. 9, 2019

(65) Prior Publication Data

US 2020/0045811 A1 Feb. 6, 2020

Related U.S. Application Data

(63) Continuation of application No. 16/170,427, filed on Oct. 25, 2018, now Pat. No. 10,485,099, which is a (Continued)

(30) Foreign Application Priority Data

Apr. 28, 2016 (JP) ................................. 2016-091781

(51) Int. Cl.
*H05K 1/02* (2006.01)
*H05K 3/46* (2006.01)
(Continued)

(52) U.S. Cl.
CPC ......... *H05K 1/0271* (2013.01); *H05K 1/0306* (2013.01); *H05K 3/46* (2013.01);
(Continued)

(58) Field of Classification Search
CPC ............ H01L 23/3733; H01L 23/3735; H05K 2203/1355; H05K 2203/1131;
(Continued)

(56) References Cited

U.S. PATENT DOCUMENTS

| 5,855,711 A | 1/1999 | Araki et al. |
| 6,139,666 A | 10/2000 | Fasano et al. |

(Continued)

FOREIGN PATENT DOCUMENTS

| JP | H10218675 A | 8/1998 |
| JP | 2000340716 A | 12/2000 |

(Continued)

OTHER PUBLICATIONS

International Search Report issued in International Application No. PCT/JP2017/007182, dated May 16, 2017.
(Continued)

*Primary Examiner* — Roshn K Varghese
(74) *Attorney, Agent, or Firm* — Arent Fox LLP (57) ABSTRACT

A multilayer ceramic substrate according to the present invention includes a plurality of base layers that are laminated containing a low-temperature co-fired ceramic material, a plurality of first constraint layers which contain a metal oxide not completely sintered at the sintering temperature of the low-temperature co-fired ceramic material and which are located between the base layers, and a protective layer which contains the metal oxide and which is in contact with an outermost base layer of the plurality of base layers in the lamination direction, and wherein X1>X2, where X1 is a content of the metal oxide in a surface section of the protective layer and X2 is a content of the metal oxide in a boundary section of the protective layer that is in contact with the outermost base layer.

20 Claims, 4 Drawing Sheets

Related U.S. Application Data continuation of application No. PCT/JP2017/007182, filed on Feb. 24, 2017.

(51) Int. Cl.
  *H05K 1/03* (2006.01)
  *H05K 1/11* (2006.01)

(52) U.S. Cl.
  CPC .......... *H05K 3/4644* (2013.01); *H05K 1/115* (2013.01); *H05K 2201/0175* (2013.01); *H05K 2201/0195* (2013.01); *H05K 2201/068* (2013.01); *H05K 2203/1131* (2013.01)

(58) Field of Classification Search
  CPC ... H05K 2201/0242; H05K 2201/0245; H05K 2201/0266; H05K 2201/0269; H05K 2201/0248; H05K 2201/0251; H05K 2201/0272; H05K 2201/0195; H05K 2201/068; H05K 2201/0209; H05K 1/0306; H05K 1/115; H05K 1/0271; H05K 3/46; H05K 3/38; H05K 3/4626; H05K 3/4635; H05K 3/4644; H05K 9/0083; H05K 3/4655
  See application file for complete search history.

(56) References Cited

U.S. PATENT DOCUMENTS

| | | | |
|---|---|---|---|
| 6,468,640 | B2 | 10/2002 | Nishide et al. |
| 6,579,392 | B1 | 6/2003 | Kameda et al. |
| 6,582,541 | B2 | 6/2003 | Nishide et al. |
| 6,984,441 | B2 | 1/2006 | Kameda et al. |
| 7,662,477 | B2 | 2/2010 | Miyauchi et al. |
| 8,241,449 | B2 | 8/2012 | Chikagawa |
| 2002/0058131 | A1 | 5/2002 | Nishide et al. |
| 2002/0155264 | A1 | 10/2002 | Nishide et al. |
| 2003/0113554 | A1 | 6/2003 | Umayahara et al. |
| 2003/0159770 | A1 | 8/2003 | Kameda et al. |
| 2004/0206546 | A1 | 10/2004 | Hoffmann |
| 2006/0046040 | A1 | 3/2006 | Kameda et al. |
| 2008/0152928 | A1 | 6/2008 | Miyauchi |
| 2009/0110893 | A1 | 4/2009 | Cho et al. |
| 2009/0117357 | A1 | 5/2009 | Cho et al. |
| 2016/0088729 | A1 | 3/2016 | Kobuke et al. |

FOREIGN PATENT DOCUMENTS

| | | |
|---|---|---|
| JP | 2001291955 A | 10/2001 |
| JP | 2003174261 A | 6/2003 |
| JP | 2004165295 A | 6/2004 |
| JP | 3554962 B2 | 8/2004 |
| JP | 2007015878 A | 1/2007 |
| JP | 2007095974 A | 4/2007 |
| JP | 2008166307 A | 7/2008 |
| JP | 2009170566 A | 7/2009 |

OTHER PUBLICATIONS

Written Opinion of the International Searching Authority issued in International Application No. PCT/JP2017/007182, dated May 16, 2017.

MULTILAYER CERAMIC SUBSTRATE

CROSS REFERENCE TO RELATED APPLICATIONS

The present application is a continuation of application Ser. No. 16/170,427, filed Oct. 25, 2018, which is a continuation of International application No. PCT/JP2017/007182, filed Feb. 24, 2017, which claims priority to Japanese Patent Application No. 2016-091781, filed Apr. 28, 2016, the entire contents of each of which are incorporated herein by reference.

FIELD OF THE INVENTION

The present invention relates to a multilayer ceramic substrate.

BACKGROUND OF THE INVENTION

Multilayer ceramic substrates are used as circuit substrates, equipped with electronic components such as semiconductor chip components, for wiring the electronic components to each other.

As an example of such a multilayer ceramic substrate, Patent Document 1 describes a composite multilayer body including first sheet layers containing a cluster of first powders and second sheet layers containing a cluster of second powders not sintered at a temperature at which at least one portion of the first powder cluster can be melted. In the composite multilayer body described in Patent Document 1, the second sheet layers are interposed between the first sheet layers, both principal surfaces of the composite multilayer body are given by the second sheet layers, the thickness of the second sheet layers laminated in an inner portion of the composite multilayer body is greater than the thickness of the second sheet layers given to the principal surfaces of the composite multilayer body, and portions of the first powder cluster are diffused or fluidized in the second sheet layers and are thereby stuck to each other. Furthermore, Patent Document 1 describes that the first powder cluster contains glass and the second powder cluster contains a ceramic powder such as alumina.

According to Patent Document 1, the composite multilayer body can be manufactured so as to have excellent dimensional accuracy because planar shrinkage during firing can be suppressed by the second powders contained in the second sheet layers.

Patent Document 1: Japanese Patent No. 3554962

SUMMARY OF THE INVENTION

However, in the case where first powders of glass or the like are diffused or fluidized in second sheet layers given to principal surfaces and are thereby stuck to each other as is the case with the composite multilayer body described in Patent Document 1, the second sheet layers contain a glass component and therefore inevitably shrink two-dimensionally. Since the glass component is contained in the second sheet layers, which are given to the principal surfaces of the composite multilayer body, the glass component is affected by an acidic or alkaline chemical solution in a plating step or the like performed after firing. Therefore, there is a problem in that the mechanical strength of a surface is reduced.

The present invention has been made to solve the above problem. It is an object of the present invention to provide a multilayer ceramic substrate of which the planar shrinkage is reduced and which has a surface with high mechanical strength.

In order to achieve the above object, a multilayer ceramic substrate according to the present invention includes a plurality of base layers that are laminated containing a low-temperature co-fired ceramic material, a plurality of first constraint layers which contain a metal oxide not completely sintered at the sintering temperature of the low-temperature co-fired ceramic material and which are placed between the base layers, and a protective layer which contains the metal oxide and which is placed outermost so as to be in contact with the outermost base layers, wherein X1>X2, where X1 is a content of the metal oxide in a surface section of the protective layer and X2 is a content of the metal oxide in a boundary section of the protective layer that is in contact with the outermost base layers.

In the multilayer ceramic substrate according to the present invention, the first constraint layers are placed between the base layers and the protective layer is placed outermost in the lamination direction. Since the metal oxide, which is contained in the first constraint layers and the protective layer, is not completely sintered at the sintering temperature of the low-temperature co-fired ceramic material, the planar shrinkage of the base layers during firing can be reduced. As a result, the dimensional accuracy of the multilayer ceramic substrate can be increased.

Furthermore, in the multilayer ceramic substrate according to the present invention, the content of the metal oxide in the surface section of the protective layer is higher than the content of the metal oxide in the boundary section of the protective layer that is in contact with the outermost base layers. Setting the content of the metal oxide in the surface section of the protective layer to be relatively high allows the content of a glass component in the surface section of the protective layer to be relatively low. As a result, the reduction of mechanical strength due to the dissolution of the glass component contained in a surface of the multilayer ceramic substrate can be prevented and therefore the surface mechanical strength of the multilayer ceramic substrate can be increased.

In the multilayer ceramic substrate according the present invention, $\alpha11 < \alpha22$ is preferably satisfied, where $\alpha11$ is the thermal expansion coefficient of the surface section of the protective layer and $\alpha22$ is the thermal expansion coefficient of the boundary section of the protective layer that is in contact with the outermost base layers. When the thermal expansion coefficient of the surface section of the protective layer is less than the thermal expansion coefficient of the boundary section of the protective layer that is in contact with the outermost base layers, a compressive stress is generated at a surface of the substrate to increase the surface mechanical strength of the multilayer ceramic substrate.

In an embodiment of the multilayer ceramic substrate according to the present invention, the protective layer includes a second constraint sublayer in contact with the outermost base layers and an outermost sublayer placed outermost in the lamination direction, the second constraint sublayer and the outermost sublayer contain the metal oxide, and $x1 > x2$ is satisfied, where $x1$ is the content of the metal oxide in the outermost sublayer and $x2$ is the content of the metal oxide in the second constraint sublayer.

When the second constraint sublayer, which contains the metal oxide, is in contact with the outermost base layers as is the case with this embodiment, the planar shrinkage of the base layers during firing can be further reduced.

Furthermore, in the embodiment, the protective layer has a two-layer structure consisting of the second constraint sublayer and the outermost sublayer and the content of the metal oxide in the second constraint sublayer is higher than the content of the metal oxide in the outermost sublayer; hence, the content of the metal oxide in the surface section of the protective layer can be adjusted above the content of the metal oxide in the boundary section of the protective layer that is in contact with the base layers.

In the embodiment, $\alpha12<\alpha23$ is preferably satisfied, where $\alpha12$ is the thermal expansion coefficient of the outermost sublayer and $\alpha23$ is the thermal expansion coefficient of the second constraint sublayer. Adjusting the thermal expansion coefficient of the outermost sublayer below the thermal expansion coefficient of the second constraint sublayer enables the thermal expansion coefficient of the surface section of the protective layer to be adjusted below the thermal expansion coefficient of the boundary section of the protective layer that is in contact with the outermost base layers.

In the embodiment, it is preferable that the second constraint sublayer is provided with a wiring conductor and the protective layer further includes a covering ceramic sublayer that is placed on the second constraint sublayer so as to cover the periphery of the wiring conductor on the second constraint sublayer. In such a state that terminal electrodes on a surface of the multilayer ceramic substrate are plated and chip components such as multilayer capacitors are mounted thereon, the stress caused by applying an external force to remove the components can be distributed to portions other than actual terminal electrodes by forming the covering ceramic sublayers, which are called framing layers, thereby enabling the fixing strength of the mounted chip components to be increased.

In an embodiment of the multilayer ceramic substrate according to the present invention, the protective layer is composed of only a second constraint sublayer in contact with the outermost base layers, the second constraint sublayer contains the metal oxide, and a surface of the second constraint sublayer is provided with a region having a metal oxide content higher than that of other regions of the second constraint sublayer. In this embodiment, the protective layer has a single-layer structure consisting of the second constraint sublayer and the second constraint sublayer surface is provided with the region having a metal oxide content relatively higher than that of the other regions of the second constraint sublayer; hence, the content of the metal oxide in the surface section of the protective layer can be adjusted above the content of the metal oxide in the boundary section of the protective layer that is in contact with the outermost base layers.

In this embodiment, a surface of the second constraint sublayer is preferably provided with a region having a thermal expansion coefficient less than that of other regions of the second constraint sublayer. Providing the second constraint sublayer surface with a region having a thermal expansion coefficient relatively less than that of other regions of the second constraint sublayer enables the thermal expansion coefficient of the protective layer to be adjusted below the thermal expansion coefficient of the boundary section of the protective layer that is in contact with the outermost base layers.

In an embodiment of the multilayer ceramic substrate according to the present invention, the protective layer includes a second constraint sublayer in contact with the outermost base layers and a covering ceramic sublayer placed on the second constraint sublayer, the second constraint sublayer is provided with a wiring conductor, the covering ceramic sublayer is located so as to cover the periphery of the wiring conductor on the second constraint sublayer, the covering ceramic sublayer contains the metal oxide, and a surface of the covering ceramic sublayer is provided with a region having a metal oxide content higher than that of other regions of the covering ceramic sublayer. In this embodiment, the protective layer has an at least two-layer structure consisting of the second constraint sublayer and the covering ceramic sublayer and the covering ceramic sublayer surface is provided with the region having a metal oxide content higher than that of the other regions of the covering ceramic sublayer; hence, the content of the metal oxide in the surface section of the protective layer can be adjusted above the content of the metal oxide in the boundary section of the protective layer that is in contact with the outermost base layers.

In this embodiment, a surface of the covering ceramic sublayer is preferably provided with a region having a thermal expansion coefficient less than that of other regions of the covering ceramic sublayer.

Providing the covering ceramic sublayer surface with a region having a thermal expansion coefficient relatively less than that of other regions of the covering ceramic sublayer enables the thermal expansion coefficient of the surface section of the protective layer to be adjusted below the boundary section of the protective layer that is in contact with the outermost base layers.

In the multilayer ceramic substrate according to the present invention, $X1>X3>X2$ is preferably satisfied, where $X3$ is the content of the metal oxide in a central section of the protective layer.

In the multilayer ceramic substrate according to the present invention, $\alpha11<\alpha33<\alpha22$ is preferably satisfied, where $\alpha33$ is the thermal expansion coefficient of the central section of the protective layer.

In the multilayer ceramic substrate according to the present invention, $X2>Y$ is preferably satisfied, where Y is the content of the metal oxide in the base layers.

In this case, the content of the low-temperature co-fired ceramic material in the base layers is relatively high; hence, the low-temperature co-fired ceramic material is likely to be sintered and the base layers can be densified.

In the multilayer ceramic substrate according to the present invention, $\alpha22<\beta$ is preferably satisfied, where η is the thermal expansion coefficient of the base layers.

In the multilayer ceramic substrate according to the present invention, the metal oxide is preferably at least one of alumina and silica. Alumina has high Mohs hardness, is chemically stable, and is therefore preferable as a metal oxide making up the protective layer. Silica is lower in Mohs hardness than alumina, is more excellent in chemical stability than alumina, is lower in dielectric constant than alumina, and is therefore very preferable as a metal oxide making up protective layers of ceramic components required to have high frequency characteristics. Thus, the strength and chemical resistance of the multilayer ceramic substrate after firing can be increased.

Incidentally, the metal oxide may be a solid solution of alumina and another component contained in the base layers; a precipitate from the reaction therebetween; a solid solution of silica and another component contained in the base layers; a precipitate from the reaction therebetween; a solid solution of alumina, silica, and another component contained in the base layers; or a precipitate from the reaction therebetween.

The multilayer ceramic substrate according to the present invention preferably further includes a wiring conductor placed in or on at least one of the outermost base layers, the first constraint layers, and the protective layer.

In this case, the multilayer ceramic substrate according to the present invention can be preferably used as a multilayer ceramic substrate, equipped with chip components such as semiconductor chip components, for wiring the electronic components to each other.

According to the present invention, a multilayer ceramic substrate of which the planar shrinkage is reduced and which has high surface mechanical strength can be provided.

DETAILED DESCRIPTION OF THE PREFERRED EMBODIMENTS

A multilayer ceramic substrate of the present invention is described below. However, the present invention is not limited to configurations below. Various modifications can be made without departing from the spirit of the present invention. Combinations of two or more of individual preferred configurations of the present invention that are described below are included in the present invention.

Embodiments below are illustrative and the partial replacement or combination of configurations described in different embodiments can be made. In a second embodiment and subsequent embodiments, items common to those described in a first embodiment are not described in detail but only items different from those described therein are described. In particular, similar effects due to similar configurations are not mentioned one by one in each embodiment.

First Embodiment

In a first embodiment of the present invention, the multilayer ceramic substrate includes a protective layer having a two-layer structure with a constraint sublayer in contact with a base layer and an outermost sublayer placed outermost in the lamination direction.

Figure 1:
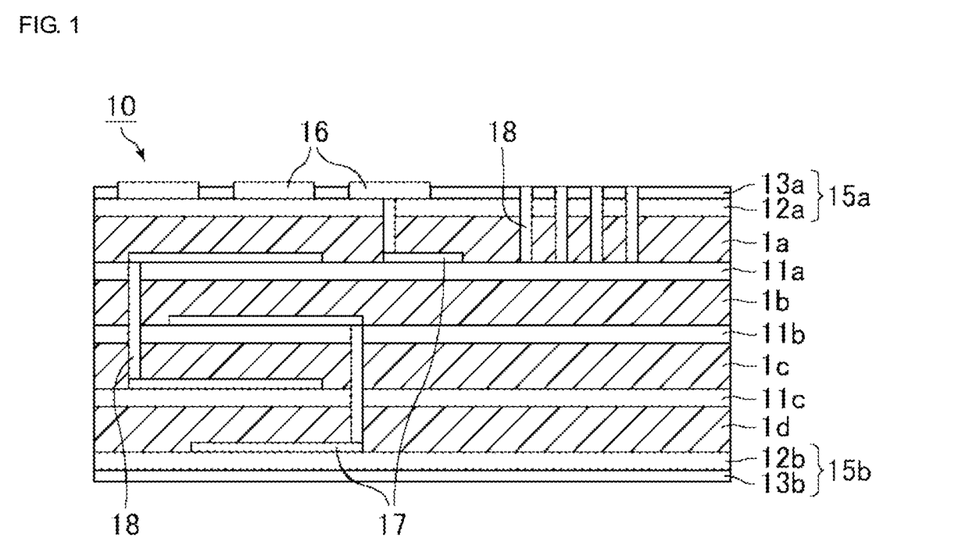
FIG. 1 is a schematic sectional view of a multilayer ceramic substrate according to a first embodiment of the present invention.

FIG. 1 is a schematic sectional view of a multilayer ceramic substrate according to the first embodiment of the present invention. As shown in FIG. 1, the multilayer ceramic substrate 10 includes laminated base layers 1a, 1b, 1c, and 1d, first constraint layers 11a, 11b, and 11c placed between the base layers 1a to 1d, and protective layers 15a and 15b placed outermost in the lamination direction so as to be in contact with the base layers 1a and 1d, respectively. The protective layer 15a is composed of a second constraint sublayer 12a in contact with the base layer 1a and an outermost sublayer 13a placed outermost in the lamination direction. The protective layer 15b is composed of a second constraint sublayer 12b in contact with the base layer 1d and an outermost sublayer 13b placed outermost in the lamination direction.

Referring to FIG. 1, each of the first constraint layers 11a to 11c is placed between corresponding two of the base layers 1a to 1d. There may be a place where no first constraint layer is placed between base layers. Referring to FIG. 1, the protective layers 15a and 15b are placed on opposed surfaces of the multilayer ceramic substrate 10 in the lamination direction.

The multilayer ceramic substrate 10 further includes wiring conductors placed in or on the base layers 1a to 1d, the first constraint layers 11a to 11c, and the protective layers 15a and 15b. The wiring conductors include outer conductor films 16 placed on an outer surface of the multilayer ceramic substrate 10; inner conductor films 17 which are placed in the multilayer ceramic substrate 10 and each of which extends along a principal surface of a corresponding one of the first constraint layers 11a to 11c and the second constraint sublayer 12b; and via-hole conductors 18 extending through the base layers 1a to 1d, the first constraint layers 11a to 11c, and the protective layers 15a and 15b in a thickness direction thereof.

The structure of the multilayer ceramic substrate 10 shown in FIG. 1 is only an example and the number of the laminated layers and/or the arrangement of the wiring conductors may be variously modified.

The wiring conductors preferably contain at least one conductive material selected from the group consisting of gold, silver, and copper, and more preferably silver or and copper. Gold, silver, and copper have low resistance and are therefore particularly suitable for a multilayer ceramic substrate for high-frequency use.

In the multilayer ceramic substrate according to the present invention, the base layers contain a low-temperature co-fired ceramic material. The low-temperature co-fired ceramic material refers to, among ceramic materials, a material which can be sintered at a firing temperature of 1,000° C. or less and which can be co-fired with silver or copper.

Examples of the low-temperature co-fired ceramic material, which is contained in the base layers, include glass composite low-temperature co-fired ceramic materials formed by mixing borosilicate glass with ceramic materials such as quartz, alumina, and forsterite; crystal glass low-temperature co-fired ceramic materials containing ZnO—MgO—$Al_2O_3$—$SiO_2$ crystal glass; and non-glass low-temperature co-fired ceramic materials formed using BaO—$Al_2O_3$—$SiO_2$ ceramic materials or $Al_2O_3$—CaO—$SiO_2$—MgO—$B_2O_3$ ceramic materials.

In the multilayer ceramic substrate according to the present invention, the first constraint layers and the protective layers contain a metal oxide not completely sintered at the sintering temperature of the low-temperature co-fired ceramic material. In the first constraint layers and the protective layers, the metal oxide is preferably in a fixed state due to the permeation of a portion of the material contained in the base layers.

In the first embodiment of the present invention, the second constraint sublayers and the outermost sublayers, which form the protective layers, contain the metal oxide.

Examples of the metal oxide, which is not completely sintered at the sintering temperature of the low-temperature co-fired ceramic material, include aluminum, silica, zirconia, titania, silica, niobium pentoxide, tantalum pentoxide, and magnesia. In particular, aluminum and silica are preferable. In consideration of high-frequency characteristics of a ceramic component, these metal oxides may be used alone or in combination.

In the multilayer ceramic substrate according to the present invention, the metal oxide contained in the first constraint layers and the metal oxide contained in the protective layers are preferably all the same type, more preferably at least one of aluminum and silica, and further more preferably aluminum.

In the multilayer ceramic substrate according to the present invention, the first constraint layers preferably contain glass in addition to the metal oxide.

The protective layers may contain glass in addition to the metal oxide. When the first constraint layers and the protective layers contain glass, the glass contained in the first constraint layers and the protective layers is, for example, B—Si-M glass (M is an alkali metal or an alkaline-earth metal) or the like.

In the multilayer ceramic substrate according to the present invention, X1>X2 is satisfied, where X1 is the content of the metal oxide in a surface section of each of the protective layers and X2 is the content of the metal oxide in a boundary section of each of the protective layers that is in contact with a corresponding one of the base layers. That is, the content of the metal oxide in the surface section of each protective layer is higher than the content of the metal oxide in the boundary section of the protective layer that is in contact with the base layer.

The content of the metal oxide is calculated in such a manner that a region of a measured target is analyzed by mapping using FE-WDX (device name: JXA-8530F manufactured by JEOL Ltd.) and the area fraction of a portion in which the metal oxide (for example, $Al_2O_3$ or $SiO_2$) is present is determined.

Furthermore, $\alpha 11 < \alpha 22$ is preferably satisfied, where $\alpha 11$ is the thermal expansion coefficient of the surface section of the protective layer and $\alpha 22$ is the thermal expansion coefficient of the boundary section of the protective layer that is in contact with the base layer. That is, the thermal expansion coefficient of the surface section of each protective layer is preferably less than the thermal expansion coefficient of the boundary section of the protective layer that is in contact with the base layer.

The thermal expansion coefficient is obtained as a value measured at a heating rate of 5° C./min from room temperature to 500° C. by thermomechanical analysis (TMA).

The term "surface section of each of the protective layers" refers to a region ranging from the outermost surface of each protective layer to one-tenth of the thickness of the protective layer in the thickness direction. However, when a plurality of sublayers included in the protective layer are present in the region, the term "surface section of each of the protective layers" refers to a layer located at the outermost surface of the protective layer. Likewise, the term "boundary section of each of the protective layers that is in contact with a corresponding one of the base layers" refers to a region ranging from the interface between each of the protective layers and a corresponding one of the base layers to one-tenth of the thickness of each of the protective layers in the thickness direction. However, when a plurality of the sublayers included in the protective layer are present in the region, the term "surface section of each of the protective layers" refers to a layer located at the interface between each of the protective layers and a corresponding one of the base layers.

In the first embodiment of the present invention, the protective layer has a two-layer structure consisting of the second constraint sublayer and the outermost sublayer and X1>X2 is satisfied by satisfying x1>x2, where x1 is the content of the metal oxide in the outermost sublayer and x2 is the content of the metal oxide in the second constraint sublayer. That is, the content of the metal oxide in the surface section of each protective layer is adjusted above the content of the metal oxide in the boundary section of the protective layer that is in contact with the base layer in such a manner that the content of the metal oxide in the outermost sublayer adjusted above the content of the metal oxide in the second constraint sublayer.

The thermal expansion coefficient of each layer can be adjusted by varying the content of the metal oxide in the layer. The thermal expansion coefficient of the outermost sublayer can be adjusted below the thermal expansion coefficient of the second constraint sublayer in such a manner that, for example, the content of the metal oxide in the outermost sublayer is adjusted above the content of the metal oxide in the second constraint sublayer. In the first embodiment of the present invention, $\alpha 11 < \alpha 22$ is preferably satisfied by satisfying $\alpha 12 < \alpha 23$, where $\alpha 12$ is the thermal expansion coefficient of the outermost sublayer and $\alpha 23$ is the thermal expansion coefficient of the second constraint sublayer. That is, the thermal expansion coefficient of the surface section of each protective layer is preferably adjusted below the thermal expansion coefficient of the boundary section of the protective layer that is in contact with the base layer in such a manner that the thermal expansion coefficient of the outermost sublayer is adjusted below the thermal expansion coefficient of the second constraint sublayer.

When the thickness of the outermost sublayer is one-tenth or more of the thickness of the protective layer, the content of the metal oxide in the outermost sublayer can be determined in such a manner that the content of the metal oxide in a region corresponding to "the surface section of the protective layer" is measured. However, when the thickness of the outermost sublayer is less than one-tenth of the thickness of the protective layer, the content of the metal oxide in the outermost sublayer can be determined in such a manner that the content of the metal oxide in the whole outermost sublayer is measured.

When the thickness of the second constraint sublayer is one-tenth or more of the thickness of the protective layer, the content of the metal oxide in the second constraint sublayer can be determined in such a manner that the content of the metal oxide in a region corresponding to "the boundary section of the protective layer that is in contact with the base layer" is measured. However, when the thickness of the second constraint sublayer is less than one-tenth of the thickness of the protective layer, the content of the second constraint sublayer in the outermost sublayer can be determined in such a manner that the content of the metal oxide in the whole second constraint sublayer is measured. The thermal expansion coefficient can be determined in substantially the same manner as the above.

In the multilayer ceramic substrate according to the present invention, X1>X3>X2 is preferably satisfied, where X3 is the content of the metal oxide in a central section of the protective layer. That is, the content of the metal oxide preferably increases from the boundary section of the protective layer that is in contact with the base layer toward the surface section of the protective layer.

Furthermore, $\alpha 11<\alpha 33<\alpha 22$ is preferably satisfied, where $\alpha 33$ is the thermal expansion coefficient of the central section of the protective layer. That is, the thermal expansion coefficient preferably decreases from the boundary section of the protective layer that is in contact with the base layer toward the surface section of the protective layer.

The term "central section of the protective layer" refers to a region including a subregion ranging from a level corresponding to half the thickness of the protective layer (excluding the thickness of a covering ceramic layer) to one-20th of the thickness (excluding the thickness of the covering ceramic layer) in the thickness direction of the protective layer toward a surface and a subregion ranging from the level to one-20th of the thickness (excluding the thickness of the covering ceramic layer) in the thickness direction of the protective layer toward the base layer. However, when a plurality of the sublayers included in the protective layer are present in the above region, this term refers to only a layer located at the level corresponding to half the thickness of the protective layer (excluding the thickness of the covering ceramic layer).

In the multilayer ceramic substrate according to the present invention, X2>Y is preferably satisfied, where Y is the content of the metal oxide in each base layer. That is, the content of the metal oxide in the boundary section of the protective layer that is in contact with the base layer is preferably higher than the content of the metal oxide in the base layer.

Incidentally, the value of the content Y of the metal oxide in the base layer may be 0.

The content of the metal oxide in the base layer can be determined in such a manner that the content of the metal oxide in a region ranging from the interface between the base layer and the protective layer to one-tenth of the thickness of the base layer in the thickness direction of the base layer is measured.

Furthermore, $\alpha 22<\beta$ is preferably satisfied, where $\beta$ is the thermal expansion coefficient of the base layer. That is, the thermal expansion coefficient of the boundary section of the protective layer that is in contact with the base layer is preferably less than the thermal expansion coefficient of the base layer.

The content of the metal oxide in each first constraint layer is not particularly limited and is preferably the same as the content of the metal oxide in the second constraint sublayer.

The content of the metal oxide in the first constraint layer can be determined in such a manner that the content of the metal oxide in a region ranging from the interface between the first constraint layer and the protective layer to one-tenth of the thickness of the first constraint layer in the thickness direction of the first constraint layer is measured.

The thermal expansion coefficient of the first constraint layer is not particularly limited and is preferably the same as the thermal expansion coefficient of the second constraint sublayer.

The thickness of the second constraint sublayer is not particularly limited. The thickness thereof is preferably 0.5 µm or more and more preferably 1 µm or more. The thickness thereof is preferably 10 µm or less and more preferably 5 µm or less.

The thickness of the outermost sublayer is not particularly limited. The thickness thereof is preferably 0.5 µm or more and more preferably 1 µm or more. The thickness thereof is preferably 3 µm or less and more preferably 2 µm or less.

The thickness of the base layer is not particularly limited. The thickness thereof is preferably 2 µm or more and is preferably 150 µm or less.

The thickness of the first constraint layer is not particularly limited. The thickness thereof is preferably 0.5 µm or more and is preferably 10 µm or less. The thickness of the first constraint layer may be the same as or different from the thickness of the second constraint sublayer.

The multilayer ceramic substrate 10 shown in FIG. 1 is preferably manufactured as described below.

Figure 2:
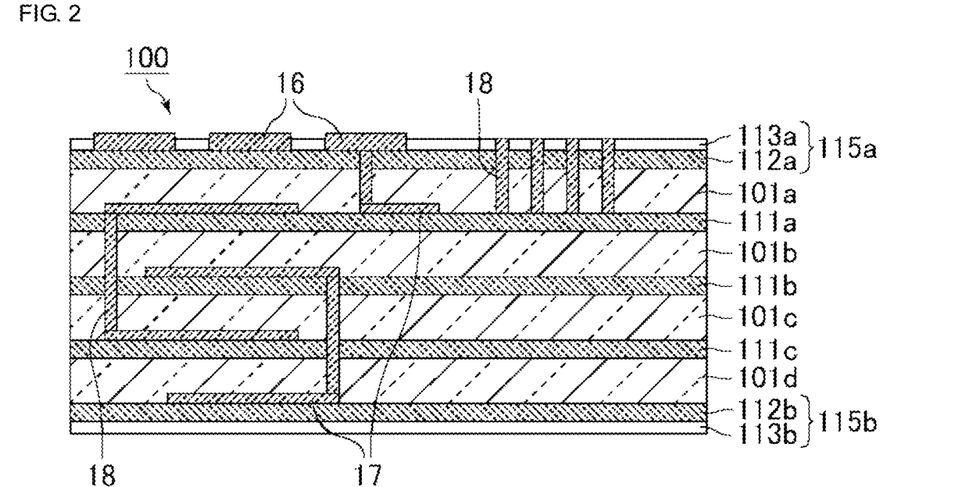
FIG. 2 is a schematic sectional view of a green multilayer body prepared in the course of manufacturing the multilayer ceramic substrate shown in FIG. 1.

FIG. 2 is a schematic sectional view of a green multilayer body prepared in the course of manufacturing the multilayer ceramic substrate shown in FIG. 1. The multilayer ceramic substrate 10 shown in FIG. 1 is obtained by firing the green multilayer body 100 shown in FIG. 2.

As shown in FIG. 2, the green multilayer body 100 includes laminated base green layers 101a, 101b, 101c, and 101d. The base green layers 101a to 101d are those fired into the base layers 1a to 1d.

The green multilayer body 100 further includes first constraint green layers 111a, 111b, and 111c placed between the base green layers 101a to 101d and protective green layers 115a and 115b placed on surfaces so as to be in contact with the base green layers 101a and 101d, respectively. The protective green layer 115a is composed of a second constraint green sublayer 112a in contact with the base green layer 101a and an outermost green sublayer 113a placed outermost in the lamination direction. The protective green layer 115b is composed of a second constraint green sublayer 112b in contact with the base green layer 101d and an outermost green sublayer 113b placed outermost in the lamination direction. The first constraint green layers 111a to 111c are those fired into the first constraint layers 11a to 11c. The second constraint green sublayers 112a and 112b, the outermost green sublayers 113a and 113b, and the protective green layers 115a and 115b are those fired into the second constraint sublayers 12a and 12b, the outermost sublayers 13a and 13b, and the protective layers 15a and 15b, respectively.

The green multilayer body 100 further includes the wiring conductors, which are placed in or on the base green layers 101a to 101d, the first constraint green layers 111a to 111c, and the protective green layers 115a and 115b. The wiring conductors include the outer conductor films 16, the inner conductor films 17, and the via-hole conductors 18 as described above and are made of an unsintered conductive paste at this stage.

The green multilayer body 100 can be prepared by, for example, the method below.

First, the following sheets are prepared: base green sheets converted into the base green layers 101a to 101d, first constraint green sheets converted into the first constraint green layers 111a to 111c, and second constraint green sheets converted into the second constraint green sublayers 112a and 112b.

The base green sheets are those obtained by forming, slurry containing, for example, powders serving as raw materials for a glass ceramic obtained by mixing unsintered low-temperature co-fired ceramic materials such as aluminum and borosilicate glass and a Ba—Al—Si—O ceramic producing a glass component during firing, an organic binder, and a solvent into sheets by a doctor blade process or the like. The slurry may contain various additives such as a dispersant and a plasticizer.

The first constraint green sheets and the second constraint green sheets are those obtained by forming, slurry containing, for example, a powder of alumina, which is a metal oxide not completely sintered at the sintering temperature of the low-temperature co-fired ceramic materials; an organic binder; and a solvent into sheets by a doctor blade process or the like. The slurry may contain glass in addition to the metal oxide and may further contain various additives such as a dispersant and a plasticizer. The first constraint green sheets and the second constraint green sheets are preferably prepared using the same slurry.

The organic binder contained in each slurry may be, for example, a butyral resin (polyvinyl butyral), an acrylic resin, a methacrylic resin, or the like. The solvent contained therein may be, for example, toluene, an alcohol such as isopropyl alcohol, or the like. The plasticizer contained therein may be, for example, di-n-butyl phthalate.

Next, the wiring conductors are formed in or on predetermined green sheets. Thereafter, the base green sheets and the first constraint green sheets are stacked such that the first constraint green sheets are placed between the base green sheets. Furthermore, the second constraint green sheets are placed outermost so as to be in contact with the base green sheets, followed by pressure bonding. Pressure bonding is performed under conditions including, for example, a temperature of 50° C. to 80° C. and a pressure of 20 MPa to 200 MPa.

The wiring conductors can be formed by applying a conductive paste.

The order of forming the wiring conductors is not particularly limited. After the wiring conductors are formed in or on predetermined green sheets, the green sheets may be stacked. The green sheets may be stacked while the wiring conductors are being formed in or on the green sheets. The outer conductor films 16 and the inner conductor films 17 can be formed in such a manner that, for example, the conductive paste is applied to the base green sheets, the first constraint green sheets, or the second constraint green sheets by screen printing. On the other hand, the via-hole conductors 18 can be formed in such a manner that, for example, through-holes are formed in the base green sheets, the first constraint green sheets, and the second constraint green sheets and the conductive paste is filled in the through-holes.

The conductive paste, which is used to form the wiring conductors, may be preferably paste containing the above-mentioned conductive material, such as copper, an organic binder, a solvent, and the like.

Subsequently, the outermost green sublayers 113a and 113b are formed on the second constraint green sheets. The above allows the green multilayer body 100 to be obtained as shown in FIG. 2.

A method for forming the outermost green sublayers is, for example, a method in which paste for forming the outermost green sublayers is applied to the second constraint green sheets by screen printing or the like.

The paste for forming the outermost green sublayers may be preferably paste containing the metal oxide contained in the first constraint layers and the second constraint sublayers, an organic binder, a solvent, and the like. The paste may contain glass in addition to the metal oxide.

In the case of forming the second constraint green sublayers and the outermost green sublayers by the above methods, the content of the metal oxide in the outermost green sublayers is adjusted above the content of the metal oxide in the second constraint green sublayers. This enables the content of the metal oxide in the outermost sublayers to be adjusted above the content of the metal oxide in the second constraint sublayers after firing and therefore enables the content of the metal oxide in the surface section of each protective layer to be adjusted above the content of the metal oxide in the boundary section of the protective layer that is in contact with the base layer.

The thermal expansion coefficient of the outermost green sublayers can be adjusted below the thermal expansion coefficient of the second constraint green sublayers in such a manner that the content of the metal oxide in the outermost green sublayers is adjusted above the content of the metal oxide in the second constraint green sublayers. This enables the thermal expansion coefficient of the outermost sublayers to be adjusted below the thermal expansion coefficient of the second constraint sublayers after firing and therefore enables the thermal expansion coefficient of the surface section of the protective layer to be adjusted below the thermal expansion coefficient of the boundary section of the protective layer that is in contact with the base layer.

Finally, the green multilayer body 100 is fired under conditions where the low-temperature co-fired ceramic materials are sintered, whereby the multilayer ceramic substrate 10 can be obtained as shown in FIG. 1.

Firing is performed under conditions including, for example, a temperature of 850° C. to 1,050° C., a time of 30 minutes to 90 minutes, and an air atmosphere or a low-oxygen atmosphere.

In the above-mentioned firing step, the first constraint green layers and the second constraint green sublayers themselves do not substantially shrink. Therefore, the first constraint green layers and the second constraint green sublayers exert a constraint force on the base green layers to reduce planar shrinkage. Therefore, in the base green layers, planar shrinkage is reduced, the low-temperature co-fired ceramic materials are sintered, and shrinkage occurs substantially in the thickness direction only, so that the base layers are formed. On the other hand, in the first constraint green layers and the second constraint green sublayers, a portion of material, such as glass, contained in the base green layers permeates, whereby the first constraint layers and the second constraint sublayers are formed in such a state that the metal oxide is fixed. As a result, the planar dimensional accuracy of the multilayer ceramic substrate can be increased.

Furthermore, since the content of the metal oxide in the outermost sublayer located at the outermost surface of the protective layer is higher than the content of the metal oxide in the second constraint sublayer in contact with the base layer, the content of the glass component in the surface section of the protective layer can be relatively reduced. As a result, the reduction of mechanical strength due to the dissolution of the glass component contained in a surface of the multilayer ceramic substrate can be prevented and therefore the surface mechanical strength of the multilayer ceramic substrate can be increased.

When the thermal expansion coefficient of the outermost sublayer located at the outermost surface of the protective layer is less than the thermal expansion coefficient of the second constraint sublayer in contact with the base layer, a compressive stress is generated at a surface of the substrate. In the case where an external force is applied to the substrate, the external force is reduced by the compressive stress. Therefore, the surface mechanical strength of the multilayer ceramic substrate is high.

A method for preparing the green multilayer body 100 is not limited to the above method. For example, a method for forming the first constraint green layers and the second constraint green sublayers may be a method in which slurry for forming the first constraint green layers and the second constraint green sublayers is prepared and is applied to the base green sheets or the like. A method for forming the outermost green sublayers may be a method in which outermost green sheets converted into the outermost green sublayers are prepared and are placed on the second constraint green sheets.

The multilayer ceramic substrate obtained by the above-mentioned method is surface-treated in such a manner that, for example, the outer conductor films are electrolessly plated with Ni and/or Au. Next, desired electronic components are mounted on the multilayer ceramic substrate so as to be electrically connected to the outer conductor films.

Examples of the electronic components mounted on the multilayer ceramic substrate include active elements such as transistors, ICs, and LSIs and passive elements such as chip capacitors, chip resistors, chip thermistors, and chip inductors.

Second Embodiment

In a second embodiment of the present invention, a protective layer has a three-layer structure and is composed of a second constraint sublayer in contact with a base layer, a covering ceramic sublayer placed on the second constraint sublayer, and an outermost sublayer placed outermost.

Figure 3:
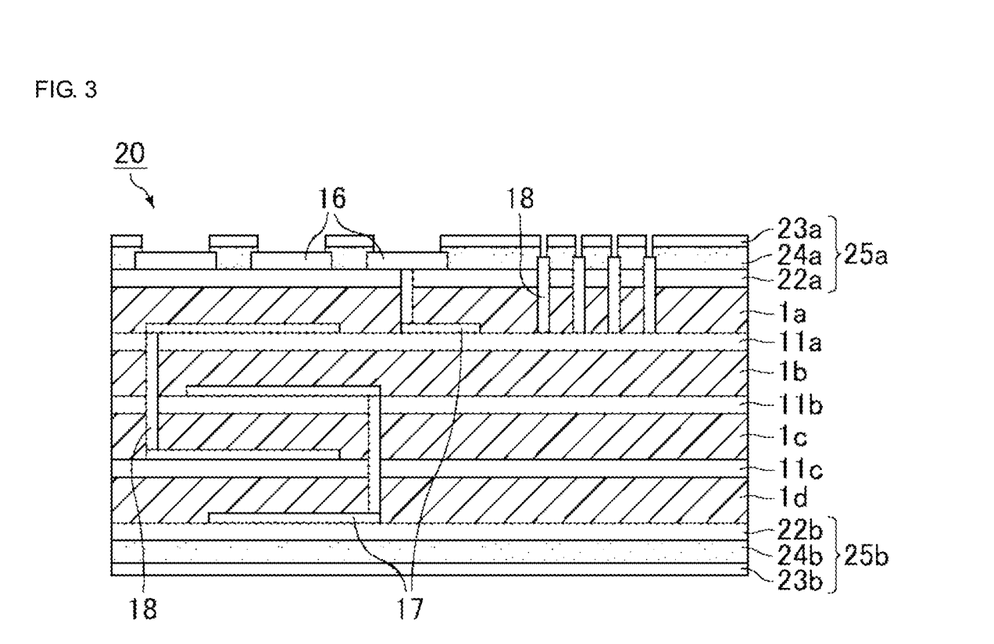
FIG. 3 is a schematic sectional view of a multilayer ceramic substrate according to a second embodiment of the present invention.

FIG. 3 is a schematic sectional view of a multilayer ceramic substrate according to the second embodiment of the present invention.

As shown in FIG. 3, the multilayer ceramic substrate 20 includes laminated base layers 1a to 1d, first constraint layers 11a to 11c placed between the base layers 1a to 1d, and protective layers 25a and 25b placed outermost so as to be in contact with the base layers 1a and 1d, respectively. The protective layer 25a is composed of a second constraint sublayer 22a in contact with the base layer 1a, a covering ceramic sublayer 24a placed on the second constraint sublayer 22a, and an outermost sublayer 23a placed outermost. The protective layer 25b is composed of a second constraint sublayer 22b in contact with the base layer 1d, a covering ceramic sublayer 24b placed on the second constraint sublayer 22b, and an outermost sublayer 23b placed outermost.

Referring to FIG. 3, the second constraint sublayer 22a is provided with wiring conductors (outer conductor films 16 and via-hole conductors 18) and the covering ceramic sublayer 24a is placed so as to cover the peripheries of the outer conductor films 16 and via-hole conductors 18 on the second constraint sublayer 22a. Portions (central portions) the outer conductor films 16 and via-hole conductors 18 on the second constraint sublayer 22a are exposed.

As shown in FIG. 3, the outermost sublayer 23a is preferably placed on the covering ceramic sublayer 24a only.

Referring to FIG. 3, no wiring conductors are placed on the second constraint sublayer 22b. Wiring conductors may be placed on the second constraint sublayer 22b. In this case, it is preferable that the covering ceramic sublayer 24b is placed so as to cover the peripheries of the wiring conductors on the second constraint sublayer 22b and the outermost sublayer 23b is placed on the covering ceramic sublayer 24b only.

The covering ceramic sublayer 24b need not placed on the second constraint sublayer 22b.

In the second embodiment of the present invention, as well as the first embodiment, the second constraint sublayer and outermost sublayer included in each protective layer both contain a metal oxide not completely sintered at the sintering temperature of any low-temperature co-fired ceramic material.

In this embodiment, though the protective layer has a three-layer structure consisting of the second constraint sublayer, the covering ceramic sublayer, and the outermost sublayer, X1>X2 is satisfied by satisfying x1>x2 as is the case with the first embodiment. Furthermore, $\alpha 11 < \alpha 22$ is preferably satisfied by satisfying $\alpha 12 < \alpha 23$.

In the second embodiment of the present invention, the type of the metal oxide contained in the second constraint sublayer and the outermost sublayer, the preferred thickness of the second constraint sublayer, and the preferred thickness of the outermost sublayer are the same as those described in the first embodiment.

In the second embodiment of the present invention, the covering ceramic sublayer preferably contains a ceramic material.

The ceramic material contained in the covering ceramic sublayer is preferably a low-temperature co-fired ceramic material. In this case, the ceramic material contained in the covering ceramic sublayer may be the same as or different from a low-temperature co-fired ceramic material contained in each base layer and is preferably the same as the low-temperature co-fired ceramic material contained in the base layer.

The covering ceramic sublayer may further contain a metal oxide not completely sintered at the sintering temperature of the low-temperature co-fired ceramic material.

The metal oxide contained in the covering ceramic sublayer is preferably the same as the metal oxide contained in the first constraint layers, the second constraint sublayer, and the outermost sublayer; more preferably at least one of alumina and silica; and further more preferably alumina.

The content of the metal oxide in the covering ceramic sublayer is not particularly limited and is preferably the same as the content of the metal oxide in the base layer.

The content of the metal oxide in the covering ceramic sublayer can be determined in such a manner that the content of the metal oxide in a region ranging from the interface between the covering ceramic sublayer and the second constraint sublayer to one-tenth of the thickness of the covering ceramic sublayer in the thickness direction of the covering ceramic sublayer is measured.

The thermal expansion coefficient of the covering ceramic sublayer is not particularly limited and is preferably the same as the thermal expansion coefficient of the base layer.

The thickness of the covering ceramic sublayer is not particularly limited. The thickness thereof is preferably 0.5 μm or more and more preferably 1 μm or more. The thickness thereof is preferably 30 μm or less and more preferably 20 μm or less.

The multilayer ceramic substrate 20 shown in FIG. 3 is preferably manufactured as described below.

Figure 4:
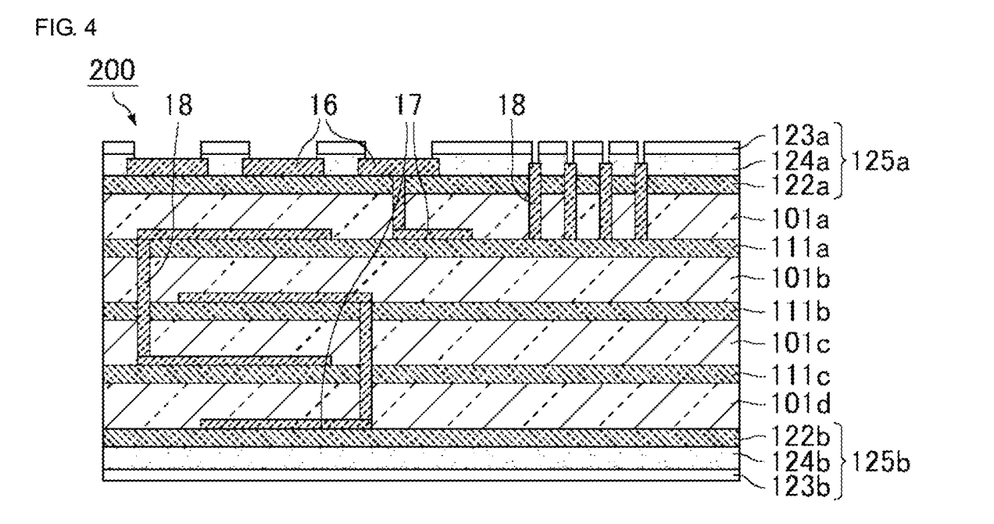
FIG. 4 is a schematic sectional view of a green multilayer body prepared in the course of manufacturing the multilayer ceramic substrate shown in FIG. 3.

FIG. 4 is a schematic sectional view of a green multilayer body prepared in the course of manufacturing the multilayer ceramic substrate shown in FIG. 3. The multilayer ceramic substrate 20 shown in FIG. 3 is obtained by firing the green multilayer body 200 shown in FIG. 4.

As shown in FIG. 4, the green multilayer body 200 includes first constraint green layers 111a to 111c placed between base green layers 101a to 101d and protective green layers 125a and 125b placed on surfaces so as to be in contact with the base green layers 101a and 101d, respectively. The protective green layer 125a is composed of a second constraint green sublayer 122a in contact with the base green layer 101a, a covering green sublayer 124a placed on the second constraint green sublayer 122a, and an outermost green sublayer 123a placed outermost. The protective green layer 125b is composed of a second constraint green sublayer 122b in contact with the base green layer 101d, a covering green sublayer 124b placed on the second constraint green sublayer 122b, and an outermost green sublayer 123b placed outermost. The covering green sublayers 124a and 124b are those fired into the covering ceramic sublayers 24a and 24b.

The green multilayer body 200 can be prepared by, for example, a method below.

First, the following sheets are prepared by substantially the same method as that used in the first embodiment: base green sheets converted into the base green layers 101a to 101d, first constraint green sheets converted into the first constraint green layers 111a to 111c, and second constraint green sheets converted into the second constraint green sublayers 122a and 122b. Next, after the wiring conductors are formed in or on predetermined green sheets, the green sheets are stacked and are pressure-bonded.

Subsequently, the covering green sublayers 124a and 124b are formed on the second constraint green sheets so as to cover the peripheries of the wiring conductors of the second constraint green sheets.

A method for forming the covering green sublayers is, for example, a method in which paste for forming the covering green sublayer is applied to the second constraint green sheets by screen printing or the like.

The paste for forming the covering green sublayers may be preferably paste containing the low-temperature co-fired ceramic material contained in the base layer, an organic binder, a solvent, and the like. The paste may contain the metal oxide contained in the first constraint layers and the second constraint sublayers.

The outermost green sublayers 123a and 123b are formed on the covering green sublayers 124a and 124b, respectively. The above allows the green multilayer body 200 to be obtained as shown in FIG. 4.

When the outermost green sublayers are formed, the same pattern as a pattern used to form the covering green sublayers is preferably printed. This enables the outermost green sublayers to be formed on the covering green sublayers only.

Finally, the green multilayer body 200 is fired under conditions where the low-temperature co-fired ceramic material is sintered, whereby the multilayer ceramic substrate 20 can be obtained as shown in FIG. 3.

In the second embodiment of the present invention, as well as the first embodiment, the planar dimensional accuracy of the multilayer ceramic substrate can be increased and the surface mechanical strength of the multilayer ceramic substrate can be increased.

Furthermore, in the second embodiment of the present invention, in such a state that terminal electrodes on a surface of the multilayer ceramic substrate are plated and chip components such as multilayer capacitors are mounted thereon, the stress caused by applying an external force to remove the components can be distributed to portions other than actual terminal electrodes by forming the covering ceramic sublayers, thereby enabling the fixing strength of the mounted chip components to be increased.

Third Embodiment

In a third embodiment of the present invention, a protective layer has a single-layer structure and is composed of only a second constraint sublayer in contact with a base layer.

Figure 5:
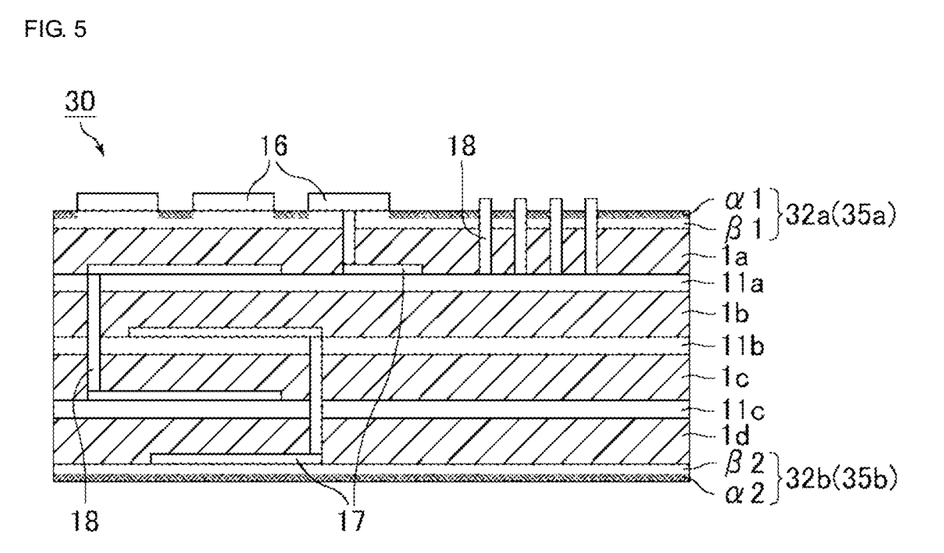
FIG. 5 is a schematic sectional view of a multilayer ceramic substrate according to a third embodiment of the present invention.

FIG. 5 is a schematic sectional view of a multilayer ceramic substrate according to the third embodiment of the present invention.

As shown in FIG. 5, the multilayer ceramic substrate 30 includes laminated base layers 1a to 1d, first constraint layers 11a to 11c placed between the base layers 1a to 1d, and protective layers 35a and 35b placed on surfaces so as to be in contact with the base layers 1a and 1d, respectively. The protective layer 35a is composed of only a second constraint sublayer 32a in contact with the base layer 1a. The protective layer 35b is composed of only a second constraint sublayer 32b in contact with the base layer 1d. The protective layers 35a and 35b are both placed outermost.

Referring to FIG. 5, a surface of the second constraint sublayer 32a, which makes up the protective layer 35a, is provided with a region α1 having a metal oxide content relatively higher than that of another region β1 of the second constraint sublayer 32a. Likewise, a surface of the second constraint sublayer 32b, which makes up the protective layer 35b, is provided with a region α2 having a metal oxide content relatively higher than that of another region β2 of the second constraint sublayer 32b.

Referring to FIG. 5, a surface of the second constraint sublayer 32a, which makes up the protective layer 35a, is provided with the region α1 and the region α1 preferably has a thermal expansion coefficient relatively less than that of the region β1 of the second constraint sublayer 32a. Likewise, a surface of the second constraint sublayer 32b, which makes up the protective layer 35b, is provided with the region α2 and the region α2 preferably has a thermal expansion coefficient relatively less than that of the region β2 of the second constraint sublayer 32b.

In the third embodiment of the present invention, each second constraint sublayer which makes up a corresponding one of the protective layers contains a metal oxide not completely sintered at the sintering temperature of any low-temperature co-fired ceramic material.

In this embodiment, each protective layer has a single-layer structure consisting of the second constraint sublayer and X1>X2 is satisfied by providing the concentration distribution of the metal oxide in the second constraint sublayer. That is, the metal oxide content of a surface section of the protective layer is adjusted above that of a boundary section of the protective layer that is in contact with the base layer in such a manner that a region having a metal oxide content relatively higher than that of other regions of the second constraint sublayer is provided in a surface of the second constraint sublayer.

Furthermore, α11<α22 is preferably satisfied by providing the concentration distribution of the metal oxide in the second constraint sublayer. That is, the thermal expansion coefficient of the surface section of the protective layer is adjusted below the boundary section of the protective layer that is in contact with the base layer in such a manner that a region having a thermal expansion coefficient relatively less than that of other regions of the second constraint sublayer is provided in a surface of the second constraint sublayer.

As is the case with the first embodiment of the present invention, X1>X3>X2 is preferably satisfied, where X3 is the content of the metal oxide in a central section of the protective layer. That is, the content of the metal oxide preferably increases from the boundary section of the protective layer that is in contact with the base layer toward the surface section of the protective layer.

Furthermore, $\alpha11 < \alpha33 < \alpha22$ is preferably satisfied, where $\alpha33$ is the thermal expansion coefficient of the central section of the protective layer. That is, the thermal expansion coefficient preferably decreases from the boundary section of the protective layer that is in contact with the base layer toward the surface section of the protective layer.

In the third embodiment of the present invention, the type of the metal oxide contained in the second constraint sublayer and the preferred thickness of the second constraint sublayer are the same as those described in the first embodiment.

The multilayer ceramic substrate 30 shown in FIG. 5 is preferably manufactured as described below.

Figure 6:
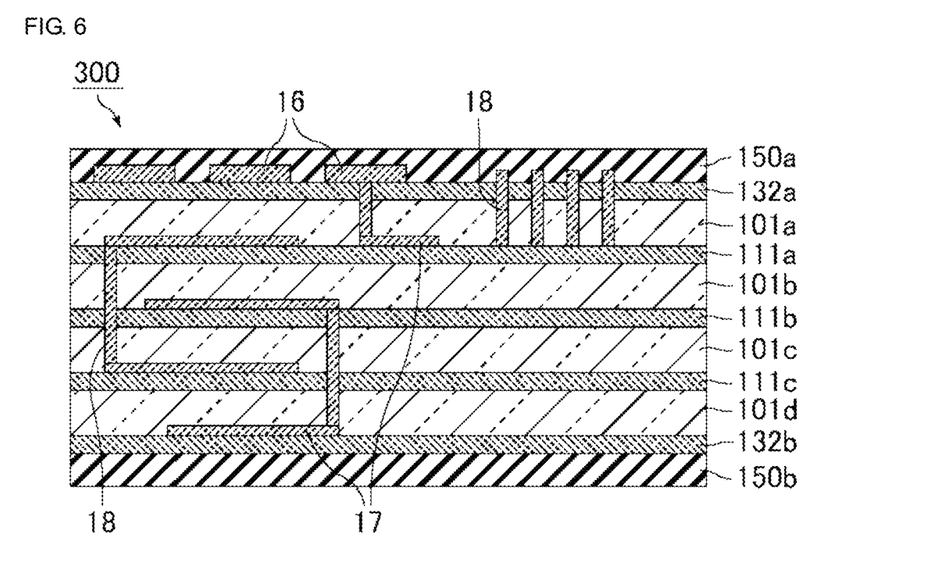
FIG. 6 is a schematic sectional view of a green multilayer body prepared in the course of manufacturing the multilayer ceramic substrate shown in FIG. 5.

FIG. 6 is a schematic sectional view of a green multilayer body prepared in the course of manufacturing the multilayer ceramic substrate shown in FIG. 5. The multilayer ceramic substrate 30 shown in FIG. 5 is obtained by firing the green multilayer body 300 shown in FIG. 6.

As shown in FIG. 6, the green multilayer body 300 includes a plurality of first constraint green layers 111a to 111c placed between base green layers 101a to 101d, a second constraint green layer 132a in contact with the base green layer 101a, and a second constraint green layer 132b in contact with the base green layer 101d and further includes third constraint green layers 150a and 150b placed outermost.

The green multilayer body 300 can be prepared by, for example, a method below.

First, the following sheets are prepared by substantially the same method as that used in the first embodiment: base green sheets converted into the base green layers 101a to 101d, first constraint green sheets converted into the first constraint green layers 111a to 111c, and second constraint green sheets converted into the second constraint green layers 132a and 132b.

Furthermore, third constraint green sheets converted into the third constraint green layers 150a and 150b are prepared.

The third constraint green sheets are those obtained by forming slurry containing, for example, a powder of alumina that is the metal oxide, which is not completely sintered at the sintering temperature of any low-temperature co-fired ceramic material; an organic binder; and a solvent into sheets by a doctor blade process or the like. The slurry may contain various additives such as a dispersant and a plasticizer.

In consideration of the fact that portions derived from the third constraint green sheets are removed after firing as described below and the fact that the third constraint green sheets are allowed to react with the second constraint green sheets, the content of the metal oxide in the third constraint green sheets is preferably higher than the content of the metal oxide in the second constraint green sheets. The thermal expansion coefficient of the third constraint green sheets is preferably less than the thermal expansion coefficient of the second constraint green sheets.

Next, after wiring conductors are formed in or on predetermined green sheets, the green sheets are stacked and are pressure-bonded. The above allows the green multilayer body 300 to be obtained as shown in FIG. 6.

Subsequently, the green multilayer body 300 is fired under conditions where the low-temperature co-fired ceramic material is sintered.

It is conceivable that, in the above-mentioned firing step, the second constraint green sheets react with the third constraint green sheets and the metal oxide contained in the third constraint green sheets diffuses and penetrates into the second constraint green sheets. As a result, in a surface of each second constraint sublayer obtained after firing, a region having a metal oxide content relatively higher than that of other regions of the second constraint sublayer is formed. The second constraint sublayer including the region serves as a protective layer.

Forming the region having a metal oxide content relatively higher than that of the other regions of the second constraint sublayer in a surface of the second constraint sublayer obtained after firing enables a region having a thermal expansion coefficient relatively less than that of other regions of the second constraint sublayer to be formed.

Thereafter, portions derived from the third constraint green layers 150a and 150b are removed, whereby the multilayer ceramic substrate 30 can be obtained as shown in FIG. 5.

In the third embodiment of the present invention, as well as the first embodiment, the planar dimensional accuracy of the multilayer ceramic substrate can be increased and the surface mechanical strength of the multilayer ceramic substrate can be increased.

Fourth Embodiment

In a fourth embodiment of the present invention, a protective layer has a two-layer structure and is composed of a second constraint sublayer in contact with a base layer and a covering ceramic sublayer placed on the second constraint sublayer.

Figure 7:
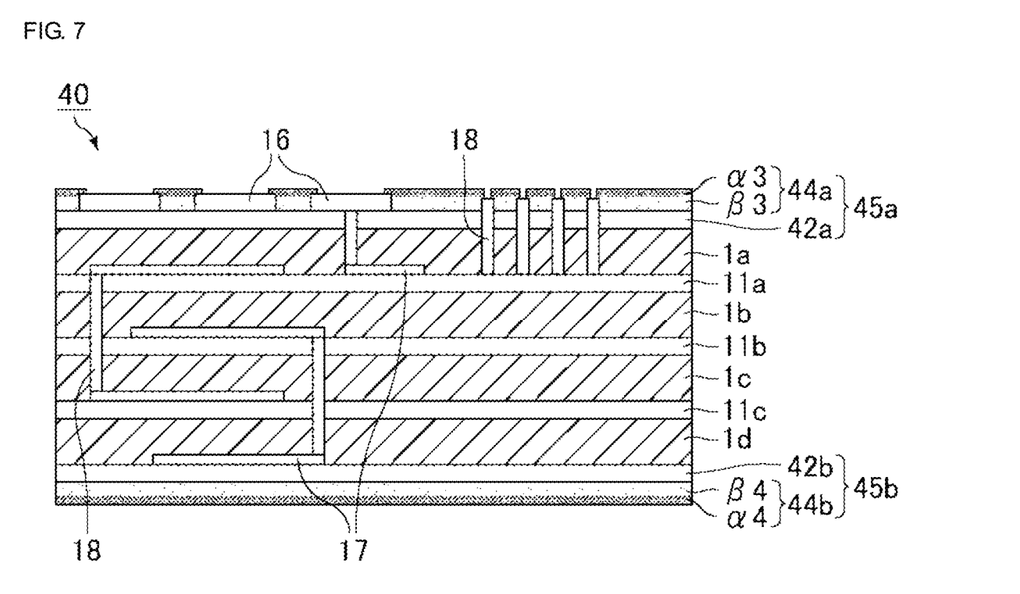
FIG. 7 is a schematic sectional view of a multilayer ceramic substrate according to a fourth embodiment of the present invention.

FIG. 7 is a schematic sectional view of a multilayer ceramic substrate according to the fourth embodiment of the present invention.

As shown in FIG. 7, the multilayer ceramic substrate 40 includes laminated base layers 1a to 1d, first constraint layers 11a to 11c placed between the base layers 1a to 1d, and protective layers 45a and 45b placed on surfaces so as to be in contact with the base layers 1a and 1d, respectively. The protective layer 45a is composed of a second constraint sublayer 42a in contact with the base layer 1a and a covering ceramic sublayer 44a placed on the second constraint sublayer 42a. The protective layer 45b is composed of a second constraint sublayer 42b in contact with the base layer 1d and a covering ceramic sublayer 44b placed on the second constraint sublayer 42b. The covering ceramic sublayers 44a and 44b are placed outermost.

Referring to FIG. 7, the second constraint sublayer 42a is provided with wiring conductors (outer conductor films 16 and via-hole conductors 18) and the covering ceramic sublayer 44a is placed so as to cover the peripheries of the outer conductor films 16 and the via-hole conductors 18 on the second constraint sublayer 42a. Each of wiring conductors (inner conductor films 17) extends along a principal surface of a corresponding one of the first constraint layers 11a to 11c and the second constraint sublayer 42b.

Referring to FIG. 7, no wiring conductors are placed on the second constraint sublayer 42b. Wiring conductors may be placed on the second constraint sublayer 42b. In this case, the covering ceramic sublayer 44b is preferably placed so as to cover the peripheries of the wiring conductors on the second constraint sublayer 42b.

The covering ceramic sublayer 44b need not placed on the second constraint sublayer 42b.

Referring to FIG. 7, a surface of the covering ceramic sublayer 44a, which is included in the protective layer 45a, is provided with a region $\alpha3$ having a metal oxide content relatively higher than that of another region $\beta3$ of the covering ceramic sublayer 44a. Likewise, a surface of the covering ceramic sublayer 44b, which is included in the protective layer 45b, is provided with a region α4 having a metal oxide content relatively higher than that of another region β4 of the covering ceramic sublayer 44b.

Referring to FIG. 7, a surface of the covering ceramic sublayer 44a, which is included in the protective layer 45a, is provided with the region α3 and the region α3 preferably has a thermal expansion coefficient relatively less than that of the region β3 of the covering ceramic sublayer 44a. Likewise, a surface of the covering ceramic sublayer 44b, which is included in the protective layer 45b, is provided with the region α4 and the region α4 preferably has a thermal expansion coefficient relatively less than that of the region β4 of the covering ceramic sublayer 44b.

In the fourth embodiment of the present invention, each second constraint sublayer which is included in a corresponding one of the protective layers contains a metal oxide not completely sintered at the sintering temperature of a low-temperature co-fired ceramic material.

The type of the metal oxide contained in the second constraint sublayer and the preferred thickness of the second constraint sublayer are the same as those described in the first embodiment.

In the fourth embodiment of the present invention, each covering ceramic sublayer which is included in a corresponding one of the protective layers contains the metal oxide, which is not completely sintered at the sintering temperature of the low-temperature co-fired ceramic material.

In this embodiment, each protective layer has a two-layer structure consisting of the second constraint sublayer and the covering ceramic sublayer and X1>X2 is satisfied by providing the concentration distribution of the metal oxide in the covering ceramic sublayer. That is, the metal oxide content of a surface section of the protective layer is adjusted above that of a boundary section of the protective layer that is in contact with the base layer in such a manner that a region having a metal oxide content relatively higher than that of other regions of the covering ceramic sublayer is provided in a surface of the covering ceramic sublayer.

In particular, the content of the metal oxide in the surface section of the protective layer can be adjusted above the content of the metal oxide in the boundary section of the protective layer that is in contact with the base layer in such a manner that the content of the metal oxide in a surface of the covering ceramic sublayer adjusted above the content of the metal oxide in the second constraint sublayer.

Furthermore, α11<α22 is preferably satisfied by providing the concentration distribution of the metal oxide in the covering ceramic sublayer. That is, the thermal expansion coefficient of the surface section of the protective layer is preferably adjusted below the boundary section of the protective layer that is in contact with the base layer in such a manner that a region having a thermal expansion coefficient relatively less than that of other regions of the covering ceramic sublayer provides in a surface of the covering ceramic sublayer.

In particular, the thermal expansion coefficient of the surface section of the protective layer is preferably adjusted below the thermal expansion coefficient of the boundary section of the protective layer that is in contact with the base layer in such a manner that the thermal expansion coefficient of a surface of the covering ceramic sublayer is adjusted below the thermal expansion coefficient of the second constraint sublayer.

In the fourth embodiment of the present invention, the type of the metal oxide contained in the covering ceramic sublayer and the preferred thickness of the covering ceramic sublayer are the same as those described in the second embodiment. As is the case with the second embodiment, the covering ceramic sublayer preferably contains a ceramic material.

The multilayer ceramic substrate 40 shown in FIG. 7 is preferably manufactured as described below.

Figure 8:
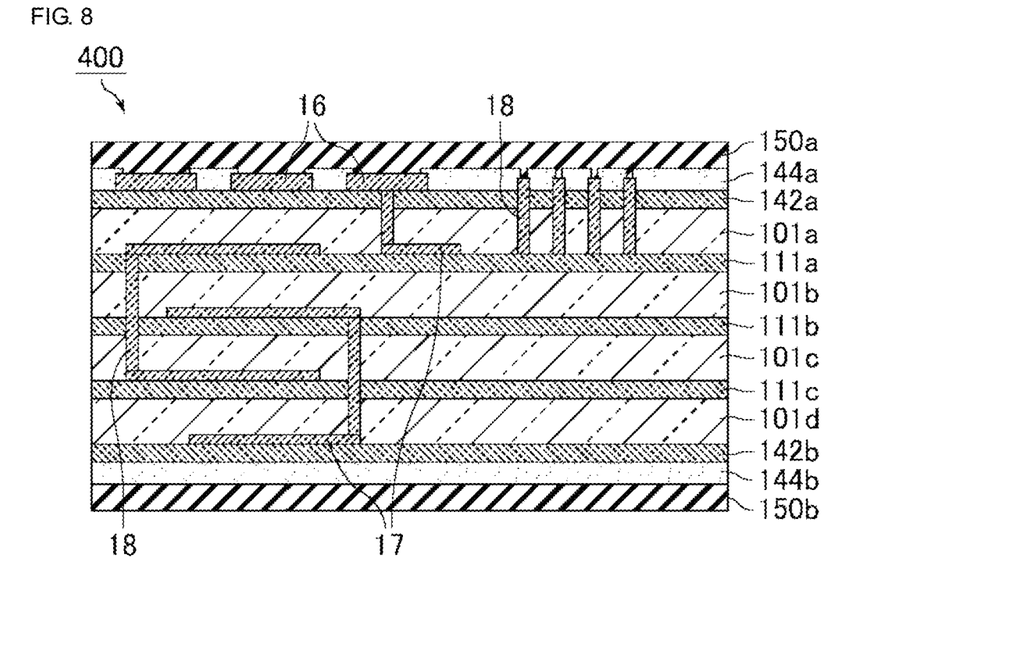
FIG. 8 is a schematic sectional view of a green multilayer body prepared in the course of manufacturing the multilayer ceramic substrate shown in FIG. 7.

FIG. 8 is a schematic sectional view of a green multilayer body prepared in the course of manufacturing the multilayer ceramic substrate shown in FIG. 7. The multilayer ceramic substrate 40 shown in FIG. 7 is obtained by firing the green multilayer body 400 shown in FIG. 8.

As shown in FIG. 8, the green multilayer body 400 includes a plurality of first constraint green layers 111a to 111c placed between base green layers 101a to 101d, a second constraint green layer 142a in contact with the base green layer 101a, a covering green layer 144a placed on the second constraint green layer 142a, a second constraint green layer 142b in contact with the base green layer 101d, and a covering green layer 144b placed on the second constraint green layer 142b, and further includes third constraint green layers 150a and 150b placed outermost.

The green multilayer body 400 can be prepared by, for example, a method below.

First, the following sheets are prepared by substantially the same method as that used in the first embodiment: base green sheets converted into the base green layers 101a to 101d, first constraint green sheets converted into the first constraint green layers 111a to 111c, and second constraint green sheets converted into the second constraint green layers 142a and 142b.

Furthermore, third constraint green sheets converted into the third constraint green layers 150a and 150b are prepared by substantially the same method as that used in the third embodiment. As described in the third embodiment, the content of the metal oxide in the third constraint green sheets is preferably higher than the content of the metal oxide in the second constraint green sheets. The thermal expansion coefficient of the third constraint green sheets is preferably less than the thermal expansion coefficient of the second constraint green sheets.

Next, after the wiring conductors are formed in or on predetermined green sheets, the green sheets other than the third constraint green sheets are stacked.

Subsequently, the covering green layers 144a and 144b are formed on the second constraint green sheets so as to cover the peripheries of the wiring conductors on the second constraint green sheets by substantially the same method as that used in the second embodiment.

Thereafter, the third constraint green sheets are arranged, followed by pressure bonding. The above allows the green multilayer body 400 to be obtained as shown in FIG. 8.

The green multilayer body 400 is fired under conditions where the low-temperature co-fired ceramic material is sintered.

It is conceivable that, in the above-mentioned firing step, the covering green sheets react with the third constraint green sheets and the metal oxide contained in the third constraint green sheets diffuses and penetrates into the covering green sheets. As a result, in a surface of each covering ceramic sublayer obtained after firing, a region having a metal oxide content relatively higher than that of other regions of the covering ceramic sublayer is formed. The covering ceramic sublayer including the region and each second constraint sublayer form a protective layer. In the protective layer formed in this manner, the content of the metal oxide in a surface of the covering ceramic sublayer is higher than the content of the metal oxide in the second constraint sublayer.

Forming the region having a metal oxide content relatively higher than that of the other regions of the covering ceramic sublayer in a surface of the covering ceramic sublayer obtained after firing enables a region having a thermal expansion coefficient relatively less than that of other regions of the covering ceramic sublayer to be formed. In the protective layer formed in this manner, the thermal expansion coefficient of a surface of the covering ceramic sublayer is less than the thermal expansion coefficient of the second constraint sublayer.

Finally, portions derived from the third constraint green layers 150a and 150b are removed, whereby the multilayer ceramic substrate 40 can be obtained as shown in FIG. 7.

In the fourth embodiment of the present invention, as well as the first embodiment, the planar dimensional accuracy of the multilayer ceramic substrate can be increased and the surface mechanical strength of the multilayer ceramic substrate can be increased.

Furthermore, as is the case with the second embodiment of the present invention, in such a state that terminal electrodes on a surface of the multilayer ceramic substrate are plated and chip components such as multilayer capacitors are mounted thereon, the stress caused by applying an external force to remove the components can be distributed to portions other than actual terminal electrodes by forming the covering ceramic sublayers, thereby enabling the fixing strength of the mounted chip components to be increased.

In the above embodiments, the case where, among sublayers included in a protective layer, a sublayer in contact with a base layer is a second constraint sublayer has been described. However, in a multilayer ceramic substrate according to the present invention, a sublayer in contact with a base layer need not be a second constraint sublayer and may be, for example, a covering ceramic sublayer.

In addition, in a multilayer ceramic substrate according to the present invention, the configuration of a protective layer may be variously modified as long as X1>X2 is satisfied. The protective layer may include a sublayer other than a second constraint sublayer, a covering ceramic sublayer, and an outermost sublayer and may include a sublayer not containing, for example, a metal oxide.

EXAMPLES

Examples are described below to disclose a multilayer ceramic substrate according to the present invention in detail. The present invention is not limited to the examples.

[Preparation of Multilayer Ceramic Substrate]

Example 1

Powders of $SiO_2$, $BaCO_3$, $Al_2O_3$, $ZrO_2$, $CaCO_3$, $B_2O_3$, $MnCO_3$, $TiO_2$, and $Mg(OH)_2$ were prepared as starting materials for a ceramic material. An organic binder, a dispersant, and a plasticizer were added to the powders, followed by mixing and grinding, whereby slurry was prepared. The obtained slurry was formed into sheets on a PET film by a doctor blade process, followed by drying, whereby base green sheets converted into base green layers were prepared.

An organic binder, a dispersant, and a plasticizer were added to a powder mixture containing an alumina powder and a B—Si—Ba glass powder, followed by mixing and grinding, whereby slurry was prepared. The obtained slurry was formed into sheets on a PET film by a doctor blade process, followed by drying, whereby first constraint green sheets converted into first constraint green layers and second constraint green sheets converted into second constraint green layers were prepared.

A glass powder and a varnish component were mixed with an aluminum powder with an average particle size of 1 μm, followed by mixing and dispersion using a three-roll mill, whereby paste for forming outermost green layers was prepared.

The average particle size $D_{50}$ of the alumina powder was determined in such a manner that a particle size distribution in the range of 0.02 μm to 1,400 μm was measured by a laser diffraction/scattering method using a particle size distribution analyzer, MT3300-EX, manufactured by BEL-Microtrac Corporation and the number average size of particles was calculated.

Ethylcellulose and a terpene solvent were mixed with a Cu powder, followed by mixing and dispersion using a three-roll mill, whereby a conductive paste for forming wiring conductors was prepared.

The conductive paste was applied to the predetermined base green sheets, first constraint green sheets, and second constraint green sheets by screen printing, whereby the wiring conductors were formed. Thereafter, the green sheets were cut to a size of 100 mm×100 mm and the second constraint green sheets, the base green sheets, and the first constraint green sheets were stacked in that order from the surface side and were pressure-bonded. Subsequently, the paste for forming outermost green layers was applied to the second constraint green sheets by screen printing. The above allowed a green multilayer body to be obtained as shown in FIG. 2.

The obtained green multilayer body was fired in a reducing atmosphere in which wiring conductors were not oxidized under conditions where the green multilayer body was held at a temperature of, for example, 950° C. to 1,000° C. for, for example, 30 minutes to 90 minutes and was then cooled to room temperature, whereby a multilayer ceramic substrate of Example 1 was obtained.

Comparative Example 1

Base green sheets only were stacked using no first constraint green sheets or second constraint green sheets and were pressure bonded, whereby a green multilayer body was obtained. No outermost green layers were formed on the base green sheets. The obtained green multilayer body was fired under the conditions used in Example 1, whereby a multilayer ceramic substrate of Comparative Example 1 was obtained.

Comparative Example 2

A green multilayer body was prepared by substantially the same method as that used in Example 1 except that no outermost green layers were formed. The obtained green multilayer body was fired under the conditions used in Example 1, whereby a multilayer ceramic substrate of Comparative Example 2 was obtained.

Examples 2 to 4 and Comparative Examples 3 and 4

Green multilayer bodies were prepared by substantially the same method as that used in Example 1 except that paste for forming outermost green layers was prepared in such a manner that a B—Si—Ba glass powder was added to an alumina powder with an average particle size of 1 μm at a ratio shown in Table 1. The obtained green multilayer bodies were fired under the conditions used in Example 1, whereby multilayer ceramic substrates of Examples 2 to 4 and Comparative Examples 3 and 4 were obtained.

Example 5

A green multilayer body was prepared in such a manner that paste for forming outermost green layers was prepared by substantially the same method as that used in Example 1 except that the average particle size of an alumina powder was changed to 0.1 μm. The obtained green multilayer body was fired under the conditions used in Example 1, whereby a multilayer ceramic substrate of Example 5 was obtained.

Example 6

A green multilayer body was prepared in such a manner that paste for forming outermost green layers was prepared by substantially the same method as that used in Example 4 except that the average particle size of an alumina powder was changed to 0.1 μm. The obtained green multilayer body was fired under the conditions used in Example 1, whereby a multilayer ceramic substrate of Example 6 was obtained.

Example 7

A green multilayer body was prepared in such a manner that paste for forming outermost green layers was prepared by substantially the same method as that used in Example 1 except that the average particle size of an alumina powder was changed to 0.5 μm. The obtained green multilayer body was fired under the conditions used in Example 1, whereby a multilayer ceramic substrate of Example 7 was obtained.

Example 8

A green multilayer body was prepared in such a manner that paste for forming outermost green layers was prepared by substantially the same method as that used in Example 4 except that the average particle size of an alumina powder was changed to 0.5 μm. The obtained green multilayer body was fired under the conditions used in Example 1, whereby a multilayer ceramic substrate of Example 8 was obtained.

[Evaluation of Multilayer Ceramic Substrates]
(Thermal Expansion Coefficient)

For the multilayer ceramic substrates of Examples 1 to 3 and Comparative Examples 3 and 4, the thermal expansion coefficient of second constraint sublayers and outermost sublayers was measured.

The thermal expansion coefficient thereof was measured at a heating rate of 5° C./min from room temperature to 500° C. by thermomechanical analysis (TMA) under conditions below.

Measurement atmosphere: nitrogen (300 mL/min)
Measurement load: 10 gf

Incidentally, Table 1 shows the relative value of the thermal expansion coefficient of a second constraint sublayer on the basis that the thermal expansion coefficient of an outermost sublayer formed in each of Examples 1 to 3 and Comparative Examples 3 and 4 is 1.

(Planar Shrinkage)

The multilayer ceramic substrates of Examples and Comparative Examples were measured for planar (longitudinal and transverse) size before and after firing. The longitudinal size and transverse size before firing were divided by the longitudinal size and transverse size, respectively, after firing and the average was defined as the "planar shrinkage".

One with a shrinkage of less than 0.001 was rated A, one with a shrinkage of 0.001 to less than 0.01 was rated B, and one with a shrinkage of 0.01 or more was rated C on the basis that the shrinkage of Comparative Example 2 was 1.

(Mechanical Strength)

The multilayer ceramic substrates of Examples and Comparative Examples were measured for flexural strength by a three-point bending test with a sample number n of 10.

One with a flexural strength of 1.2 or more was rated A, one with a flexural strength of 1.0 to less than 1.2 was rated B, and one with a flexural strength of less than 1.0 was rated C on the basis that the flexural strength of Comparative Example 2 was 1.

Table 1 shows the average particle size of alumina contained in the second constraint green layers, the volume ratio of alumina to glass contained in the second constraint green layers, the thickness of the second constraint green layers after firing, the thermal expansion coefficient of the second constraint green layers, the average particle size of alumina contained in the outermost green layers, the volume ratio of alumina to glass contained in the outermost green layers, the thickness of the outermost green layer after firing, the thermal expansion coefficient of the outermost green layers, and evaluation results of the multilayer ceramic substrates.

TABLE 1

| | Second constraint green layer | | | Second constraint layer | Outermost green layer | | |
|---|---|---|---|---|---|---|---|
| | Alumina average particle size [μm] | Alumina to glass (volume ratio) | Thickness after firing [μm] | Thermal expansion coefficient (relative value) | Alumina average particle size [μm] | Alumina to glass (volume ratio) | Thickness after firing [μm] |
| Comparative Example 1 | | Not formed | | — | | Not formed | |
| Comparative Example 2 | 1 | 60:40 | 3 | — | | Not formed | |
| Example 1 | 1 | 60:40 | 3 | 2 | 1 | 100:0 | 1 |
| Example 2 | 1 | 60:40 | 3 | 1.5 | 1 | 90:10 | 1 |
| Example 3 | 1 | 60:40 | 3 | 1.2 | 1 | 80:20 | 1 |
| Example 4 | 1 | 60:40 | 3 | — | 1 | 70:30 | 1 |
| Comparative Example 3 | 1 | 60:40 | 3 | 1 | 1 | 60:40 | 1 |
| Comparative Example 4 | 1 | 60:40 | 3 | 0.5 | 1 | 40:60 | 1 |

TABLE 1-continued

| | | | | | | | |
|---|---|---|---|---|---|---|---|
| Example 5 | 1 | 60:40 | 3 | — | 0.1 | 100:0 | 1 |
| Example 6 | 1 | 60:40 | 3 | — | 0.1 | 70:30 | 1 |
| Example 7 | 1 | 60:40 | 3 | — | 0.5 | 100:0 | 1 |
| Example 8 | 1 | 60:40 | 3 | — | 0.5 | 70:30 | 1 |

| | Outermost layer Thermal expansion coefficient (relative value) | Evaluation | | |
|---|---|---|---|---|
| | | Planar shrinkage | Mechanical strength | Overall rating |
| Comparative Example 1 | — | C | C | C |
| Comparative Example 2 | — | — | — | — |
| Example 1 | 1 | A | A | A |
| Example 2 | 1 | A | A | A |
| Example 3 | 1 | B | B | B |
| Example 4 | — | B | B | B |
| Comparative Example 3 | 1 | C | C | C |
| Comparative Example 4 | 1 | C | C | C |
| Example 5 | — | A | A | A |
| Example 6 | — | B | B | B |
| Example 7 | — | A | A | A |
| Example 8 | — | B | B | B |

Table 1 confirms that Examples 1 to 8, in which the content of alumina in the outermost green layers is higher than the content of alumina in the second constraint green layers, exhibit lower shrinkage due to firing and higher mechanical strength as compared to Comparative Example 2, in which no outermost green layers were formed.

In the case of comparing Examples 1 to 4, it is conceivable that as the content of alumina in an outermost green layer is higher, the shrinkage due to firing is more reduced and the mechanical strength is higher.

From the results of Examples 5 to 8, it is confirmed that an effect similar to that obtained in Examples 1 to 4 is obtained even in the case where the average particle size of alumina contained in an outermost green layer is different from the average particle size of alumina contained in a second constraint green layer.

However, it is confirmed that, in Comparative Example 1, the shrinkage due to firing is high and the mechanical strength is low because no first constraint green layers or second constraint green layers were formed.

It is confirmed that, in Comparative Example 3, the shrinkage due to firing is not reduced and the mechanical strength is low because the content of alumina in the outermost green layers is the same as the content of alumina in the second constraint green layers.

Likewise, it is confirmed that Examples 1 to 3, in which the thermal expansion coefficient of the outermost layers is less than the thermal expansion coefficient of the second constraint green layers, exhibit lower shrinkage due to firing and higher mechanical strength as compared to Comparative Example 2, in which no outermost green layers were formed. In the case of comparing Examples 1 to 3, it is conceivable that as the thermal expansion coefficient of an outermost layer is less than that of a second constraint layer, the shrinkage due to firing is more reduced and the mechanical strength is higher.

It is confirmed that, in Comparative Example 3, the shrinkage due to firing is not reduced and the mechanical strength is low because the thermal expansion coefficient of the outermost layers is the same as the thermal expansion coefficient of the second constraint layers. It is confirmed that, in Comparative Example 4, the shrinkage due to firing is not reduced and the mechanical strength is low because the thermal expansion coefficient of the outermost layers is greater than the thermal expansion coefficient of the second constraint layers.

REFERENCE SIGNS LIST 10, 20, 30, 40: Multilayer ceramic substrate
1a, 1b, 1c, 1d: Base layer
11a, 11b, 11c, 11d: First constraint layer
12a, 12b, 22a, 22b, 32a, 32b, 42a, 42b: Second constraint sublayer
13a, 13b, 23a, 23b: Outermost sublayer
24a, 24b, 44a, 44b: Covering ceramic sublayer
15a, 15b, 25a, 25b, 35a, 35b, 45a, 45b: Protective layer
16: Outer conductor films
17: Inner conductor films
18: Via-hole conductors
100, 200, 300, 400: Green multilayer body
101a, 101b, 101c, 101d: Base green layer
111a, 111b, 111c, 111d: First constraint green layer
112a, 112b, 122a, 122b, 132a, 132b, 142a, 142b: Second constraint green sublayer
113a, 113b, 123a, 123b: Outermost green sublayer
124a, 124b, 144a, 144b: Covering green sublayer
115a, 115b, 125a, 125b: Protective green layer
150a, 150b: Third constraint green layer
α1, α2, α3, α4: Region having relatively high metal oxide content
β1, β2, β3, β4: Region having relatively low metal oxide content

The invention claimed is:

1. A multilayer ceramic substrate comprising:
a plurality of base layers that are laminated containing a low-temperature co-fired ceramic material;
a plurality of first constraint layers which contain a metal oxide that is not completely sintered at a sintering temperature of the low-temperature co-fired ceramic material and which are located between adjacent base layers of the plurality of laminated base layers; and
a protective layer which contains the metal oxide and which is located outermost in a lamination direction of the plurality of laminated base layers and is in contact with an outermost base layer of the plurality of laminated base layers in the lamination direction, wherein X1>X2, where X1 is a first content of the metal oxide in a surface section of the protective layer and X2 is a second content of the metal oxide in a boundary section of the protective layer that is in contact with the outermost base layer, wherein the protective layer includes a second constraint sublayer in contact with the outermost base layer and an outermost sublayer located outermost in the lamination direction, the second constraint sublayer and the outermost sublayer contain the metal oxide, and x1>x2 is satisfied, where x1 is a first content of the metal oxide in the outermost sublayer and x2 is a second content of the metal oxide in the second constraint sublayer, and wherein X2>Y, where Y is a third content of the metal oxide in the base layer.

2. The multilayer ceramic substrate according to claim 1, wherein $\alpha 11 < \alpha 22$, where $\alpha 11$ is a first thermal expansion coefficient of the surface section of the protective layer and $\alpha 22$ is a second thermal expansion coefficient of the boundary section of the protective layer.

3. The multilayer ceramic substrate according to claim 1, wherein $\alpha 12 < \alpha 23$, where $\alpha 12$ is a first thermal expansion coefficient of the outermost sublayer and $\alpha 23$ is a second thermal expansion coefficient of the second constraint sublayer.

4. The multilayer ceramic substrate according to claim 1, further comprising a wiring conductor on the second constraint sublayer, and wherein the protective layer further includes a covering ceramic sublayer on the second constraint sublayer so as to cover a periphery of the wiring conductor.

5. The multilayer ceramic substrate according to claim 4, wherein the covering ceramic sublayer contains a second low-temperature co-fired ceramic material.

6. The multilayer ceramic substrate according to claim 5, wherein the covering ceramic sublayer contains the metal oxide.

7. The multilayer ceramic substrate according to claim 1, wherein X1>X3>X2, where X3 is a third content of the metal oxide in a central section of the protective layer.

8. The multilayer ceramic substrate according to claim 1, wherein $\alpha 22 < \beta$, where $\alpha 22$ is a first thermal expansion coefficient of the boundary section of the protective layer, and is a second thermal expansion coefficient of the base layer.

9. The multilayer ceramic substrate according to claim 1, wherein the metal oxide is at least one of alumina and silica.

10. The multilayer ceramic substrate according to claim 1, further comprising a wiring conductor in or on at least one of the outermost base layer, the first constraint layers, and the protective layer.

11. The multilayer ceramic substrate according to claim 1, wherein the low-temperature co-fired ceramic material is selected from glass composite low-temperature co-fired ceramic materials, crystal glass low-temperature co-fired ceramic materials, and non-glass low-temperature co-fired ceramic materials.

12. The multilayer ceramic substrate according to claim 1, wherein the metal oxide includes at least one of aluminum, silica, zirconia, titania, silica, niobium pentoxide, tantalum pentoxide, and magnesia.

13. The multilayer ceramic substrate according to claim 1, wherein the first metal oxide contained in the first constraint layers and the second metal oxide contained in the protective layer are the same.

14. A multilayer ceramic substrate comprising:
a plurality of base layers that are laminated containing a low-temperature co-fired ceramic material;
a plurality of first constraint layers which contain a metal oxide that is not completely sintered at a sintering temperature of the low-temperature co-fired ceramic material and which are located between adjacent base layers of the plurality of laminated base layers; and
a protective layer which contains the metal oxide and which is located outermost in a lamination direction of the plurality of laminated base layers and is in contact with an outermost base layer of the plurality of laminated base layers in the lamination direction,
wherein X1>X2, where X1 is a first content of the metal oxide in a surface section of the protective layer and X2 is a second content of the metal oxide in a boundary section of the protective layer that is in contact with the outermost base layer,
wherein the protective layer includes a second constraint sublayer in contact with the outermost base layer and an outermost sublayer located outermost in the lamination direction, the second constraint sublayer and the outermost sublayer contain the metal oxide, and x1>x2 is satisfied, where x1 is a first content of the metal oxide in the outermost sublayer and x2 is a second content of the metal oxide in the second constraint sublayer, and
wherein $\alpha 11 < \alpha 33 < \alpha 22$, where $\alpha 11$ is a first thermal expansion coefficient of the surface section of the protective layer, $\alpha 22$ is a second thermal expansion coefficient of the boundary section of the protective layer, and $\alpha 33$ is a third thermal expansion coefficient of the central section of the protective layer.

15. The multilayer ceramic substrate according to claim 14, wherein X2>Y, where Y is a third content of the metal oxide in the base layer.

16. The multilayer ceramic substrate according to claim 14, wherein $\alpha 22 < \beta$, where $\alpha 22$ is a first thermal expansion coefficient of the boundary section of the protective layer, and $\beta$ is a second thermal expansion coefficient of the base layer.

17. The multilayer ceramic substrate according to claim 14, wherein the metal oxide is at least one of alumina and silica.

18. The multilayer ceramic substrate according to claim 14, further comprising a wiring conductor in or on at least one of the outermost base layer, the first constraint layers, and the protective layer.

19. The multilayer ceramic substrate according to claim 14, wherein the low-temperature co-fired ceramic material is selected from glass composite low-temperature co-fired ceramic materials, crystal glass low-temperature co-fired ceramic materials, and non-glass low-temperature co-fired ceramic materials.

20. The multilayer ceramic substrate according to claim 14, wherein the metal oxide includes at least one of aluminum, silica, zirconia, titania, silica, niobium pentoxide, tantalum pentoxide, and magnesia.

* * * * *